United States Patent [19]

Gandhi

[11] Patent Number: 4,672,309
[45] Date of Patent: Jun. 9, 1987

[54] RF PERSONNEL DOSIMETER AND DOSIMETRY METHOD FOR USE THEREWITH

[75] Inventor: Om P. Gandhi, Salt Lake City, Utah

[73] Assignee: Dosimeter Corporation of America, Cincinnati, Ohio

[21] Appl. No.: 735,963

[22] Filed: May 20, 1985

[51] Int. Cl.$^4$ .............................................. G01T 1/02
[52] U.S. Cl. ..................................... 324/95; 364/414
[58] Field of Search ................. 324/158 R, 96, 95, ; 364/483, 550, 556, 414; 128/653, 805, 908

[56] References Cited

U.S. PATENT DOCUMENTS 3,789,834  2/1974  Duroux .............................. 128/653
4,245,649  1/1981  Schmidt-Anderson ........ 128/804 X

FOREIGN PATENT DOCUMENTS 2122092  1/1984  United Kingdom ................ 128/804

OTHER PUBLICATIONS

O. P. Gandhi, *Dosimetry-The Absorbtion Properties of Man and Experimental Animals* Bulletin of the New York Academy of Medicine, Second Series, vol. 55, No. 11, pp. 999–1020, Dec. 1979.

O. P. Gandhi, et al., *An Empirical Relationship for Electromagnetic Energy Absorption in Man for Near-Field Exposure Conditions*, IEEE Transactions on Microwave Theory & Techniques vol. MTT-29, No. 11, pp. 1235–1238, Nov. 1981.

O. P. Gandhi et al., *Numerical and Experimental Results for Near Field Electromagnetic Absorbtion in Man*, IEEE Transactions on Microwave Theory and Techniques vol. 30, No. 11, pp. 2000–2005, Nov. 1982.

T. D. Bracken, *Field Measurements and Calculations of Effects of Overhead Transmission Lines*, IEEE Transactions on Power Apparatus and Systems, vol. PAS-95 No. 2, pp. 494–504 Mar./Apr. 1976.

American National Safety Standard Safety Levels with Respect to Human Exposure to Radio Frequency Electromagnetic Fields, 300 KHz to 100 GHz, ANSI C95.1-1982, Approved Jul. 30, 1982.

Gronhaug and Busmundrud, *Antenna Effect of the Human Body EMP*, (publication date unknown).

R. A. Tell et al., *Electric and Magnetic Field Intensities and Associated Induced Body Currents in Man in Close Proximity to a 50 KW A/m Standard Broadcasting Station* (not known if or when published).

D. W. Deno, *Currents Induced in the Human Body by High Voltage Transmission Line Electric Field—Measurement and Calculation of Distribution and Dose*, IEEE Transactions on Power Apparatus and Systems, vol. PAS-96, No. 5, pp. 1517–1572 Sep./Oct. 1977.

O. P. Gandhi et al., *Radio-Frequency Hazards in the VLF to MF Band* Proceedings of the IEEE, vol. 70, No. 12, pp. 1462–1464, Dec. 1982.

O. P. Gandhi et al., *Likelihood of High Rates of Energy Deposition in the Human Legs at the ANSI Recommended 3-30 MHZ RF Safety Levels*, Proceedings of the IEEE vol. 73, No. 6, pp. 1145–1147, Jun. 1985.

C. H. Durney et al., *Radio Frequency Dosimetry Handbook* 2nd Ed. Report SAM-TR-78-22 May 1978.

A. W. Guy and C. K. Chou, *Hazard Analysis: Very Low Frequency Through Medium Frequency Range* (publication date unknown).

*Primary Examiner*—Reinhard J. Eisenzopf
*Assistant Examiner*—Stephen M. Baker
*Attorney, Agent, or Firm*—Wood, Herron & Evans

[57] ABSTRACT

A method and apparatus adapted to be worn by a person for measuring radio frequency (RF) energy absorbed by a person's body in the frequency range of 10 KHz–42 MHz wherein the person's height is less than ¼ of the free space wavelength of the radiation.

25 Claims, 11 Drawing Figures

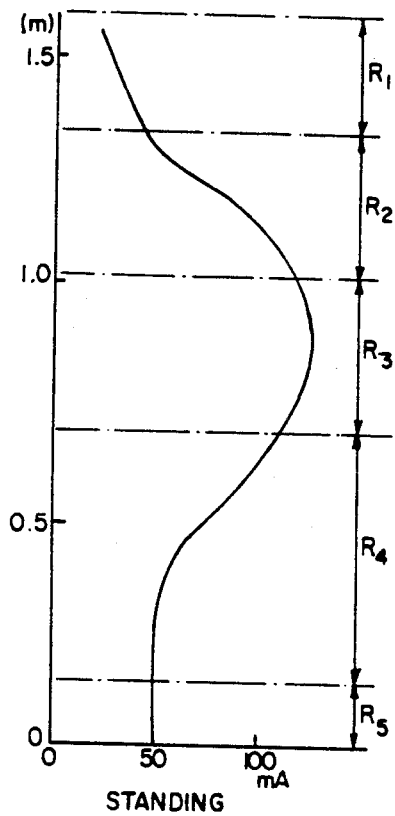
FIG.6a STANDING
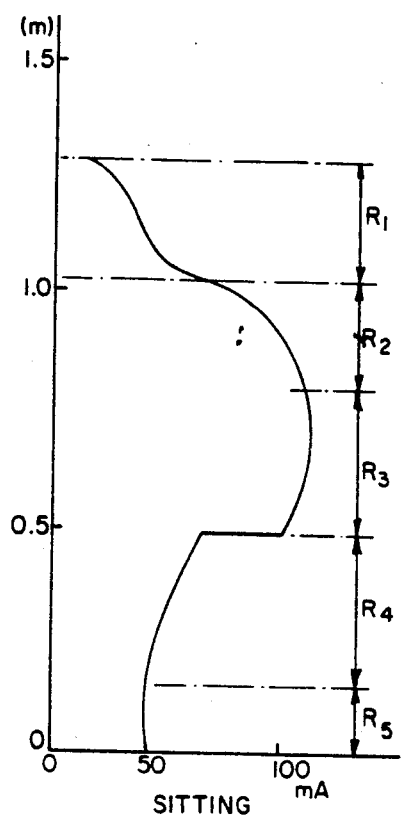
FIG.6b SITTING
| FREQUENCY MHz | SITTING $R_{eq}(\Omega)$ | STANDING $R_{eq}(\Omega)$ |
|---|---|---|
| 0.01 | 552 | 580 |
| 0.03 | 516 | 532 |
| 0.1 | 436 | 468 |
| 0.3 | 389.6 | 420 |
| 1.0 | 368.8 | 391.2 |
| 3.0 | 335.6 | 338.8 |
| 27.0 | | 321.2 |
FIG. 7

RF PERSONNEL DOSIMETER AND DOSIMETRY METHOD FOR USE THEREWITH

This invention relates to dosimetry, and more particularly to a method and apparatus for measuring the amount of radio frequency (RF) energy absorbed by a person in the frequency range of 10 KHz-42 MHz where the height of the person is less than ¼ of the free space wavelength of the radiation.

It has been known for some time that unwanted radio frequency radiation, including radiation in the range of 10 KHz-42 MHz, incident on the human body from a variety of types of equipment frequently found in or near the workplace cause body heating, fatigue, hyperactivity, and hormone changes. Included among the various types of equipment which generate radiation in the 10 KHz-42 MHz range of interest herein are: VLF, LF and MF communication equipment, RF heaters and sealers, hyperthermia devices for therapy, and AM and shortwave broadcasting transmitters. Not emitting in this frequency range are television and FM broadcasting equipment, radar, and microwave ovens, which emit at considerably higher frequencies. Depending upon the proximity of the RF source to an individual upon which the radiation is incident, the radiation is considered either "near-field" or "far-field". Both types are potentially dangerous. As such, it is desirable to continuously monitor both near-field and far-field radiation absorbed by an individual. The resulting RF dosage information enables health hazards to be assessed and the deleterious effects of overdoses avoided.

Although the desirability of being able to continuously monitor and provide dosage information with respect to RF energy absorbed by an individual, including radiation in the 10 KHz-42 MHz range, has been known, an inexpensive, accurate, reliable, and sufficiently compact and portable dosimeter for the 10 KHz-42 MHz range has not been made insofar as it is known. Accordingly, it is an objective of this invention to provide a compact and lightweight RF dosimeter adapted to be conveniently mounted on the body of the user which can be calibrated to accurately and reliably measure the bodily-absorbed radiation, either near-field or far-field, in the frequency range of approximately 42 MHz and below. This objective has been accomplished in accordance with certain of the principles of this invention by providing an apparatus and method which measures the current flowing between (a) the foot of a standing or sitting individual subjected to radiation and (b) an electrically grounded support surface in contact with the individual's foot, and uses the foot current so measured for controlling the dosimeter indicator or readout after suitable signal processing in a computing section to satisfy the equation:

$$\text{Specific Absorption Rate (SAR)} = (1/W) I_F^2 R_{eq},$$

where $W$ = the weight of the person in kilograms;
$I_F$ = the current flowing between the sole of one of the individual's feet and an electrically grounded support surface on which the individual is standing or sitting; and
$R_{eq}$ = the equivalent resistance that provides the specific absorption rate or power absorbed by the individual's body as a function of the foot current $I_F$.

In accordance with a preferred embodiment of the invention, the dosimeter includes a foot current sensor insertable in the user's shoe between the insole and the sole of the user's foot for providing an electrical signal correlated to the foot current, $I_F$, passing between the sole of the user's foot and an electrically grounded support surface, such as the floor, on which the person, either sitting or standing, has his foot in contact with. The foot current sensor includes a pair of closely spaced electrically conductive plates configured in the shape of the foot between which is sandwiched an electrically insulating substrate. A noninductive resistor $R_s$ of approximately 5-10 ohms is electrically connected between the plates across which is present an RF output voltage correlated to the magnitude of the RF foot current. It is this voltage which is processed in the computing section of the dosimeter to provide a signal to the indicating section for displaying in humanly perceptible form the specific absorption rate, SAR, as well as the accumulated energy or dose absorbed over a specified interval, for example, six minutes.

In the preferred embodiment of the invention, the computing circuit, which is responsive to the RF voltage across the sensing resistor connected between the spaced conductive plates, includes a band pass filter for passing only foot signal components in the desired RF band of 10 KHz-42 MHz. Also included is a one-half wave RF rectifier responsive to the output of the band pass filter for providing a signal proportional to 1.414 $I_F R_s$. A squaring circuit transforms this signal into a signal correlated to $2 I_F^2 R_s^2$ which is then input to a multiplier circuit where it is multiplied by the reciprocal of the person's weight, the equivalent resistance $R_{eq}$, and a calibrating factor $\tfrac{1}{2} R_s^2$. The output of the multiplier equals $(1/W) I_F^2 R_{eq}$, which is the specific absorption rate (SAR). This output is input to an analog or digital display calibrated in watts/kilograms for providing a humanly perceptible display of the specific absorption rate. In addition, the output of the multiplier is integrated over a suitable interval, such as six minutes, and the output thereof fed to an accumulated dose display, either analog or digital, where the accumulated dose over a six minute interval in watt-minutes/kilograms is displayed.

In accordance with a further aspect of the invention, a very unobvious and advantageous method is provided for ascertaining the equivalent resistance $R_{eq}$ that enables computation of the specific absorption rate (SAR) by the body in terms of the foot current $I_F$ measured by the foot current sensor of the dosimeter. This method includes the step of measuring the actual impedance of various zones of the body, such as, the head and neck region, upper torso, lower torso, legs, and feet, at various frequencies in the 10 KHz-42 MHz range of interest. With the actual impedance of the various body zones of a person measured, the person (sitting or standing, as desired) is then subjected to radiation (far-field or near-field, as desired) in the frequency range of interest and the actual voltage across each body zone separately measured. Knowing the measured impedance of each body zone, as well as the measured voltage across each body zone for the specific posture and type of radiation of interest, the actual current induced in each body zone for that posture (sitting or standing) as a consequence of irradiation by that RF source (near-field or far-field) can be calculated using the formula $I = V/R$. With the impedance of each body zone and the current flowing therethrough as a consequence of incident radiation being known, the equivalent resistance $R_{eq}$ for a specific combination of posture and type of radiation source to satisfy the equation $SAR = 1/W \, I_F^2 \times R_{eq}$ can be calculated by computing the equivalent resistance $R_{eq}$ in accordance with the following derived equation:

$$R_{eq} = [(I_1/I_F)^2 R_1 + (I_2/I_F)^2 R_2 + (I_3/I_F)^2 R_3 + \tfrac{1}{2}(I_4/I_F)^2 R_4 + 2R_5]$$

where $I_F$ is the current flowing through one foot, $I_1$, $I_2$, $I_3$, and $I_4$ are the currents respectively flowing in the head and neck, upper torso, lower torso, and leg zones, and $R_1$, $R_2$, $R_3$, $R_4$, and $R_5$ are the respective impedances of the head and neck, upper torso, lower torso, leg and foot zones.

The value of the equivalent resistance $R_{eq}$ is then input to the multiplier of the computing section of the dosimeter, enabling the indicating section of the dosimeter to provide a humanly perceptible readout, either digital or analog, of the specific absorption rate and/or the accumulated dose over a selected period of time for the specific combination of posture and type of radiation source used to calibrate the dosimeter. Calibration for other "posture/radiation source" combinations can be done in similar fashion.

These and other features, objectives, and advantages of the invention will become more readily apparent from a detailed description thereof taken in conjunction with drawings in which.

Figures 4A, 4B:
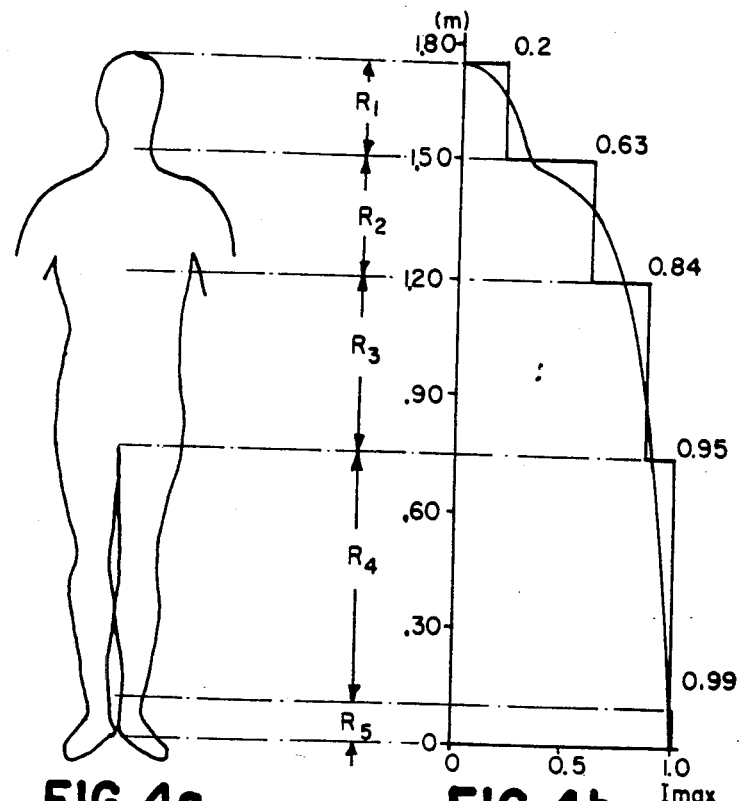

FIGS. 4a–b are a schematic view of a standing user's body divided into five zones (FIG. 4a) along with a current distribution plot (FIG. 4b) correlating, on a zone-by-zone basis, the distribution of electrical current flow in a human body subjected to plane-wave irradiation from a far-field source while standing on an electrically grounded surface.

Figures 5A, 5B:
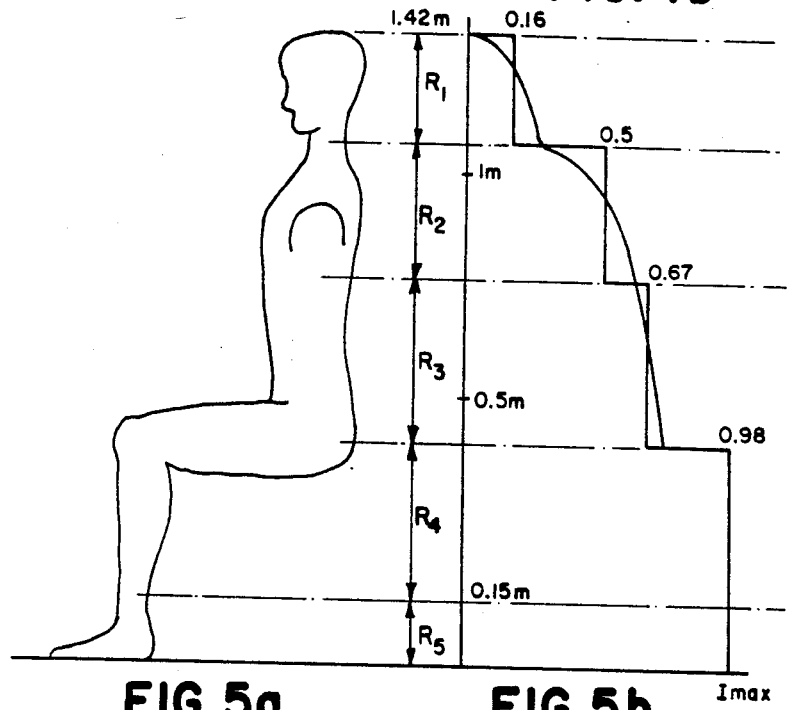

FIGS. 5a–b are a schematic view of a sitting user's body divided into five zones (FIG. 5a), and a plot of electrical current distribution (FIG. 5b) correlating, on a zone-by-zone basis, the distribution of electrical current for in a human body subjected to plane-wave irradiation from a far-field source while standing on an electrically grounded surface.

FIGS. 6a and 6b are plots of electrical current distribution, similar to those of FIGS. 4b and 5b, for an electrically grounded individual in standing and sitting postures correlating the distribution of electrical current when subjected to radiation from a near-field source.

FIG. 7 is a table showing the equivalent resistance $R_{eq}$ for individuals in sitting and standing postures subjected to plane-wave radiation from a far-field source over the frequency range of 10 KHz–27 MHz.

Figure 1:
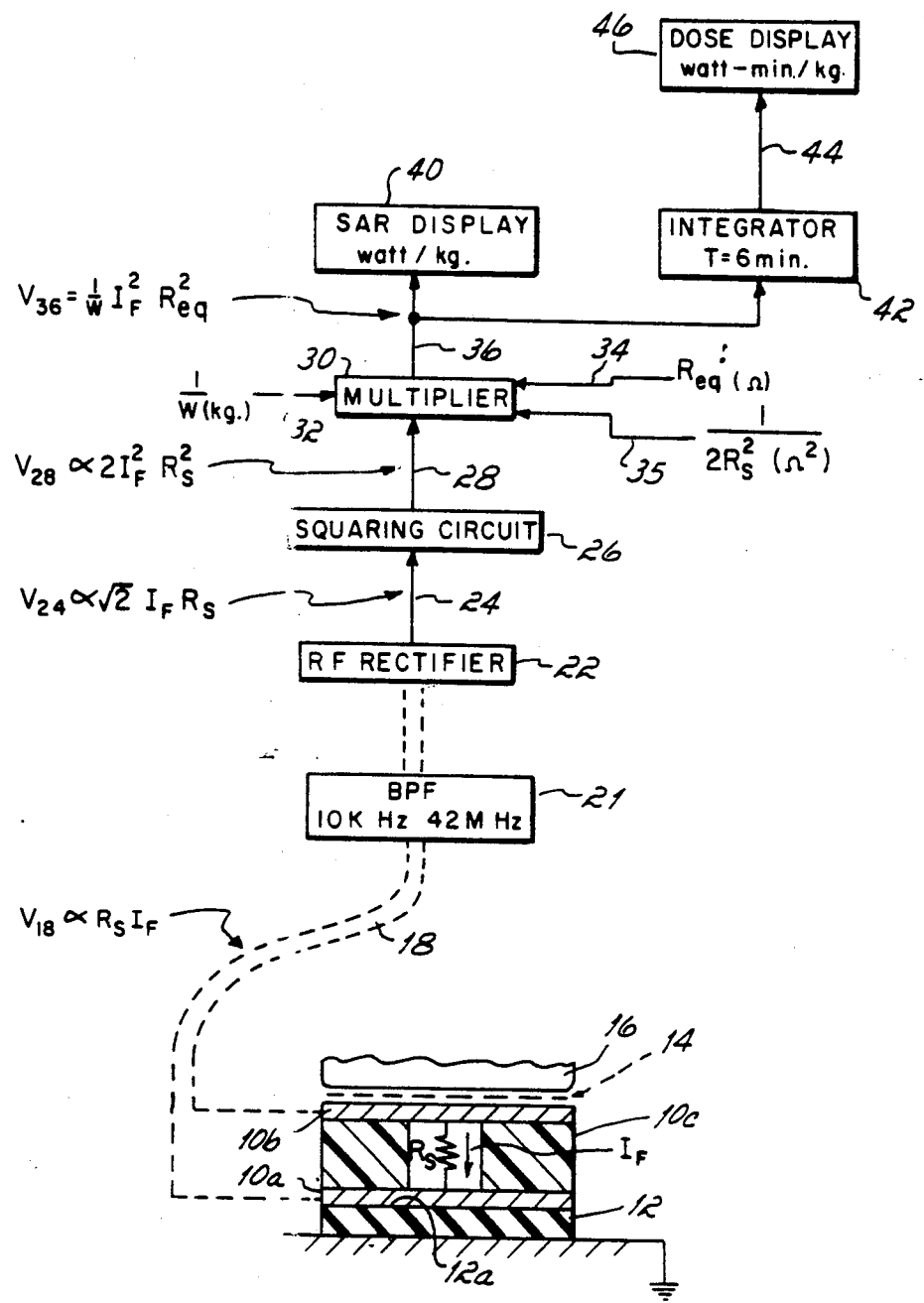
FIG. 1 is a schematic view of the dosimeter of this invention showing a vertical cross sectional view of a sensor for monitoring the current flowing between the user's foot and ground, as well as the principal circuit components for displaying specific absorption rate and the average dose over a specified interval.

With reference to FIG. 1, an RF personnel dosimeter is shown of a type adapted to be worn by a user for monitoring RF radiation absorbed by the user over the frequency band in which the dimensions of the human body are smaller than one-quarter of the free space wavelength of the radiation, namely, in the frequency band of approximately 10 KHz–42 MHz. In this frequency range, quasi-static approximation is capable of predicting the current induced in the human body and the various parts thereof when subjected to incident plane-wave radiation fields from both near and far sources. Radiation in this band is typically found in a variety of workplace environments from sources such as VLF, LF, and MF communication equipment, RF heaters and sealers, RF hyperthermia devices for cancer therapy, shortwave diathermy units, video display terminals, AM broadcast equipment and the like. Not included within the range of radio frequency energy sensed by the personnel dosimeter of this invention is radiation from sources such as FM broadcast equipment, TV equipment, microwave ovens, and radar apparatus.

In radiation environments of the type with which the dosimeter of this invention is useful, the electric field, rather than the magnetic field, is the predominant source of energy absorbed by the body when postured in a standing or sitting position with the person's feet supported on an electrically grounded surface, such as a factory floor. The electric field generated by the electrically grounded radiation source wants to terminate at ground potential, and since the field is generally in a vertical plane, the human body functions as a conductive path to ground. Since the electric field is predominant due to electrical grounding of the RF source, in the frequency band of interest (10 KHz–42 MHz), the electric field is principally responsible for inducing electrical current flow in the body which tends to flow through the user's feet to ground potential. Additionally, in the frequency band of interest the spatial electrical current distribution in the body is substantially independent of the frequency of the radiation.

The personnel dosimeter depicted in FIG. 1, considered in more detail, is seen to include a foot mounted electrical current sensor 10 which is adapted to be conveniently worn in the shoe between the shoe insole 12 and the wearer's sock 14 which envelops the sole of his foot 16. The electrical current sensor 10, in a manner to be described in more detail hereafter, provides an RF output $V_{18}$ on electrically shielded RF cable 18 correlated to the product of the resistance of resistor $R_s$ and the current flow $I_F$ between the sole of the user's foot 16 and a footsupporting platform 20, such as the floor, which is maintained at electrical ground potential. An RF rectifier 22, preferably in the form of a one-half wave rectifier, converts the RF signal on shielded cable 18 to one-half wave rectified current on line 24 which is correlated in magnitude to $(2)^{\frac{1}{2}}$ multiplied by the RF foot current $I_F$ flowing between the sole of the user's foot 16 and the electrically grounded support surface 20 on which the user is standing at his workplace. A band pass filter 21 limits the output signal from the foot sensor 10 present on line 18, which is input to the RF rectifier 22, to the frequency range of interest (10 KHz–42 MHz).

A squaring circuit 26 is responsive to the foot current correlated signal on line 24 for providing an output $V_{28}$ on line 28 correlated to the product of the square of the foot current $I_F$ flowing between the user's foot 16 and ground 20 and the square of the resistance of resistor $R_s$. Also included is a multiplier 30 which is responsive to the signal on line 28. The multiplier 30 has a first input 32 correlated to the reciprocal of the user's body weight, 1/W (kilograms) for mass normalizing the foot current to facilitate providing a specific absorption rate indication (SAR), in a manner to be described in more detail hereafter. The multiplier 30 also includes an input 34 for providing a signal correlated to an equivalent resistance, $R_{eq}$, that enables an indication of the specific absorption rate (SAR), to be provided by the dosimeter for the energy absorbed by the human body as a function of the foot current $I_F$ flowing between the user's foot 16 and the electrically grounded surface 20. A calibration factor, $\frac{1}{2}R_s^2$, input to the multiplier 30 on line 35. The multiplier 30, which is responsive to the squared foot current signal on line 28, provides an output signal on line 36 correlated to specific absorption rate (SAR) in accordance with the following formula:

$$SAR = (1/W) I_F^2 R_{eq}$$

An appropriate indicating device 40, for example an analog moving pointer meter, is responsive to the SAR correlated output from the multiplier 30 on line 36 for providing a visual display of the instantaneous electrical power or energy absorbed by the user. The display device 40 is preferably calibrated in watts/Kg. If desired, the SAR display 40 can be of the digital display type. The specific absorption rate signal, on line 36, is also input to an integrator 42 which integrates the specific absorption rate for an arbitrary interval, which in accordance with standard published by American National Standards Institute, is six minutes. The integrated output of the specific absorption rate SAR over the specified six-minute interval, which is present on integrator output line 44, is input to a dose display 46. The dose display 46, which may be either of the analog or digital display type, and preferably calibrated in units of watt-min./Kg, is updated at intervals corresponding to the integration period of the integrator 42 which, in the preferred embodiment, is six minutes.

The foot-mounted electrical current sensor 10, which senses the RF current $I_F$ flowing between the sole 16 of the user's foot and an electrically grounded support 20, in a preferred form, includes a pair of electrically conductive plates 10a and 10b which are configured to conform to the outline of the user's foot such that they can conveniently be inserted in the user's shoe atop the upper surface 12a of the shoe insole 12. To electrically insulate the plates 10a and 10b from each other, an electrically nonconductive layer of insulation 10c is sandwiched between the plates. If desired, the plates 10a and 10b can be electrically conductive foil secured to opposite sides of an insulative substrate such as is commonly found in printed circuit board technology. The thickness of the parallel plate sensor 10, which as noted may be formed by using a section of two-sided metal-clad plastic, is not critical, and may be any convenient dimension, for example, 1/16 inch or ⅛ inch. Electrically connected between the conductive plates 10a and 10b and positioned in a cavity in insulation 10c is a noninductive resistor $R_s$ of 5-10 ohms, which results in an RF voltage $V_{18}$ being created across sensing resistor $R_s$ as a consequence of the RF current $I_F$ flowing through the sensing resistor from the sole of the user's foot 16 to electrically grounded surface 20 on which the user's foot is supported. The RF voltage $V_{18}$ across sensing resistor $R_s$, which is output on line 18, is correlated to the product $I_F R_s$, and can be used to determine the RF foot current $I_F$ flowing between the sole of the user's foot 16 and ground 20.

The upper surface of conductive plate 10b of the foot current sensor 10 may be coated with a thin insulating layer, for example epoxy, if desired, to protect it from corrosion. Since this insulating layer is thin, the equivalent series capacitance is fairly large, which results in a relatively negligible series reactance to the flow of RF current through the sensor 10 between the sole of the user's foot 16 and electrically grounded surface 20.

The sock 14 of the user, when moistened with natural perspiration of the user's foot, is sufficiently electrically conductive in the frequency range of interest (10 KHz-42 MHz) to provide reliable operation.

A "dummy" two-sided electrically conductive parallel plate sensor with an insulative layer sandwiched therebetween and a noninductive resistor of 5-10 ohms, identical to sensor 10, should be used in the other shoe of the user to equalize the height above ground 20 of the soles of both of the user's feet, and to maintain a balanced flow of current between electrically grounded surface 20 and each of the user's feet. The dummy sensor is not shown in the Figures.

The dosimeter of this invention is designed to be usable for radio frequency radiation levels in the approximate range 0.001-1 mW/cm² (milliwatts per square centimeter). The corresponding far-field equivalent electric field E for these power densities varies from 1.94-61.4 V/m (volts per meter). The electrical current $I_h$ induced in a human exposed to incident plane-wave fields is given by the following empirical equation:

$$I_h = 0.108 h_m^2 f E \text{ (milliamps)}$$

where
$h_m$ is the height of the subject in meters;
f is the frequency of the incident field in megahertz (MHz); and
E is the electric field strength of the incident wave in volts/meter.

Using the foregoing equation for induced current $I_h$, for the lowest electric field of 1.94 volts per meter, $I_h$ varying from 6.4 microamperes to 26.95 microamperes can be calculated for frequencies varying from 10 KHz to 42 MHz, respectively. The currents are 31.6 times higher for an E-field of 61.4 volts per meter than those noted above. More particularly, the equation for $I_h$ yields a 0.2 milliampere current at 10 KHz, and an 852 milliamp current at 42 MHz. Recognizing that one-half of the current flows through each of the user's legs, the RF voltage $V_{18}$ across the sampling resistor $R_s$ of 5 ohms will vary from 16 microvolts to 2.13 volts for the desired limits of operation of the dosimeter.

Since the specific absorption rate (SAR) of the body is proportional to the square of the frequency of the radiation source impinging on the body, the dosimeter of this invention inherently integrates the fields impinging on the human body at all frequencies in the design range of 10 KHz to 42 MHz.

Figure 2:
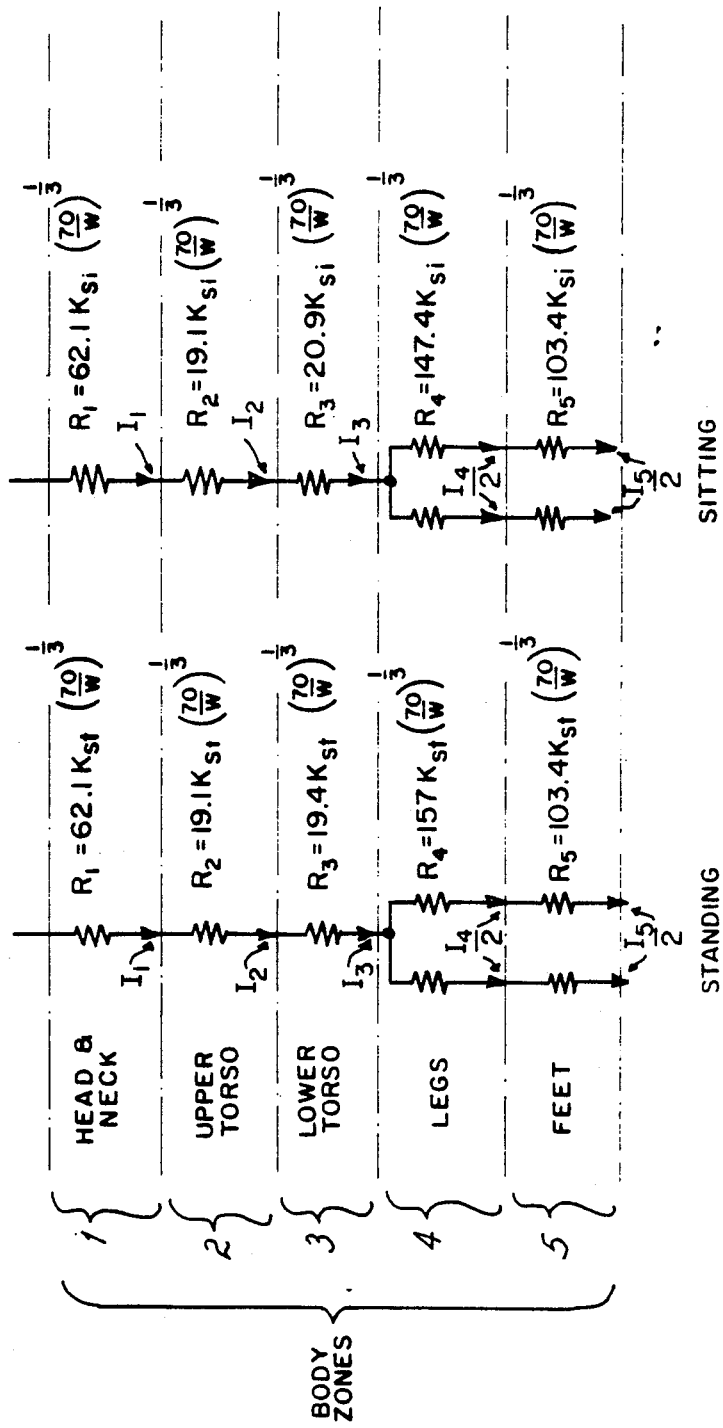
FIGS. 2a and 2b are schematic resistive circuit network models of the human body when postured in standing and sitting positions, respectively.

To facilitate a more complete understanding of the operation of the dosimeter shown in FIG. 1, reference is made to FIG. 2. More particularly, Fig. 2a represents a resistive network model of the human body (divided into five body zones 1, 2, ... 5) postured in a standing position when irradiated with energy less than 42 MHz, wherein $R_1$ represents the impedance of head and neck zone 1, resistor $R_2$ represents the impedance of upper torso zone 2, resistor $R_3$ represents the impedance of lower torso zone 3, resistor $R_4$ represents the impedance of each of the legs of zone 4, and resistor $R_5$ represents the impedance of each of the feet of zone 5. The body section impedances $R_1, R_2, \ldots R_5$ are predominantly resistive due to the relatively low frequency involved, namely, below 42 MHz, with the conductive component of the current being 3–4 times higher than the reactive component. The current $I_1$ represents the current flowing through the combined head and neck impedance $R_1$; the current $I_2$ represents the current flowing through the upper torso impedance $R_2$; the current $I_3$ represents the current flowing through the lower torso impedance $R_3$; the current $I_4$ represents the combined current flowing through the impedance of both legs, with the current $I_4/2$ representing the current flowing through the impedance of each of the the upper legs $R_4$; and the current $I_5$ represents the combined current flowing through the impedance of both feet $R_5$, with the current $I_5/2$ representing the current flowing through the impedance of one foot. The impedance values shown in FIG. 2a for impedances $R_1, R_2, R_3, R_4$, and $R_5$ have been determined empirically in a manner to be described, and are the same whether or not the radiation is from a near-field or a far-field source.

The constant $K_{st}$ represents a proportionality factor which reflects the frequency of radiation since the impedance of the human body is slightly frequency dependent. The proportionality factor $(70/W)^{\frac{1}{3}}$ represents a normalization factor which normalizes the individual weight of the person with respect to the weight of a standard or reference person considered to be 70 kilograms. The cube root factor reflects the fact that it is known that the impedance of a human is linearly proportional to the height of the person, which in turn is proportional to the cube root of the person's weight W inasmuch as a person's weight is proportional to the person's volume which has the dimensions of (meters)$^3$.

FIG. 2b similarly depicts the resistive network model of a person in a sitting posture when irradiated at frequencies less than 42 MHz. Except for the value of impedance for the lower torso $R_3$ and the legs $R_4$, which are greater and lesser, respectively, for the sitting position than for the standing position, the impedance network for the sitting position is the same as that for the standing position. The impedance networks of FIGS. 2a and 2b for the standing and sitting positions, respectively, are representative for irradiation frequencies below 42 MHz. This is a consequence of the quasi-static nature of the field due to the fact that the height of the person being irradiated with plane-wave radiation in the frequency band indicated is less than one-quarter of the free space wavelength of the radiation. The specific impedance values shown in FIGS. 2a and 2b, which have been empirically determined in a manner to be described, are representative of the impedance values when standing and sitting individuals, respectively, are irradiated from radiation in the 10 KHz–42 MHz range from a source. The proportionality constant $K_{si}$, like constant $K_{st}$, reflects the frequency dependent nature of the human body impedance. The proportionality factor $(70/W)^{\frac{1}{3}}$ normalizes the user's weight to a reference weight of 70 Kg.

The value of the impedances of $R_1, R_2, \ldots R_5$ corresponding to various zones of the body, 1, 2, 3, 4, and 5, can be measured with conventional RF impedance meters, such as of the type available from Hewlett Packard Company, Palo Alto, Calif., designated Models 4800A and 4815A. Impedance meters of the foregoing type, which cover different ranges, include a pair of test probes which can be connected to various points of the human body for the purpose of ascertaining the impedance of the human body located in the zone or section between the points whereat the probes are connected. The impedance meter contains a source of electrical RF current of selectively controllable frequency which is passed through the body zone under test via the test probes. The RF impedance meter, while the electrical current is being passed through the body zone under test, measures the voltage across the section of the body through which the electrical current is passed and then computes the impedance by dividing the measured voltage by the known current being passed through the body section under test, providing an RF impedance output calibrated in ohms.

Figure 3:
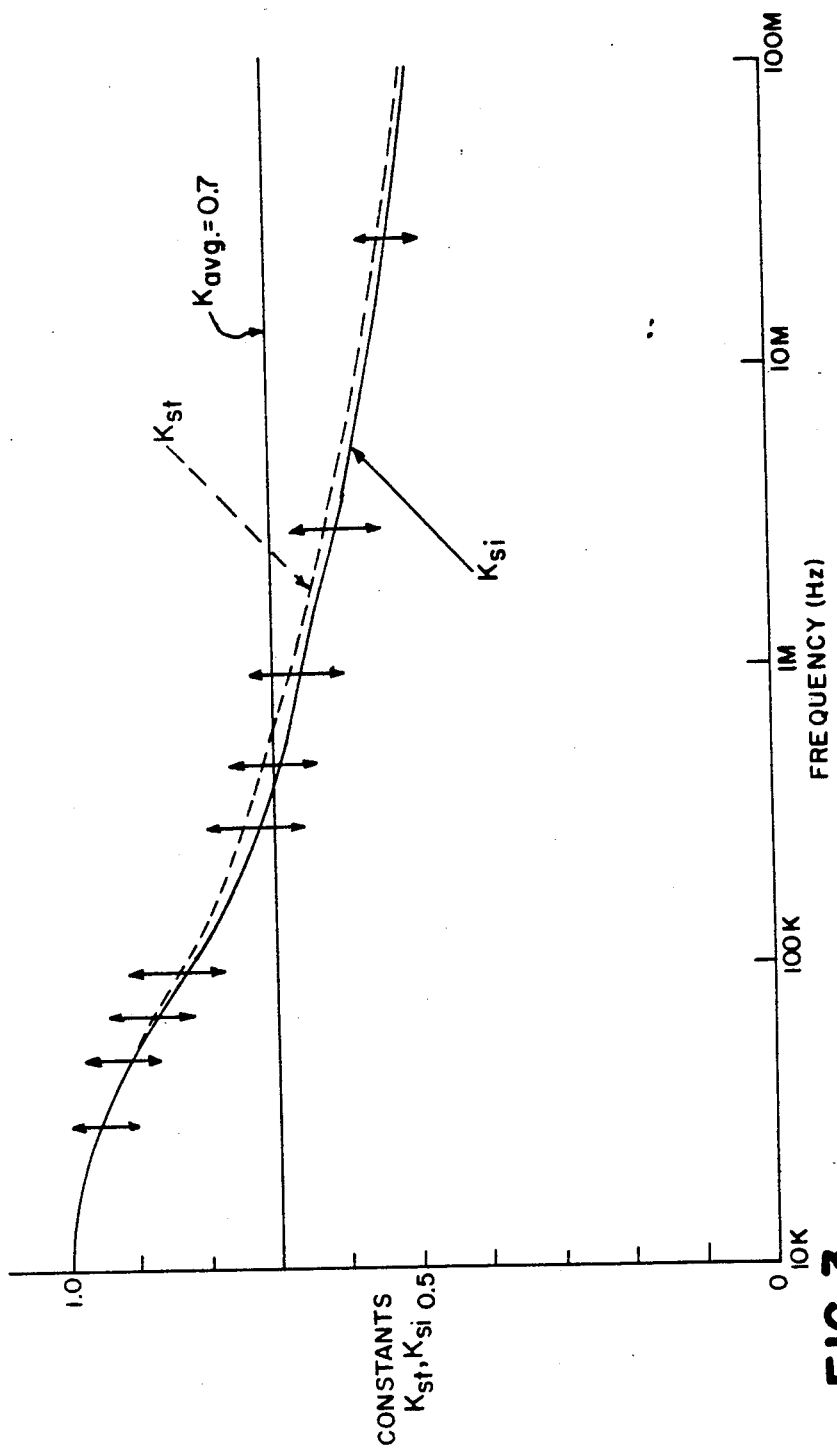
FIG. 3 is a plot of proportionality constants $K_{st}$ and $K_{si}$ versus frequency showing the relatively limited frequency dependence of the impedance of the human body in the frequency range 10 KHz–100 MHz.

Accordingly, using an impedance meter of the type described, the impedance $R_1, R_2, \ldots R_5$ of each of the five body sections 1, 2, . . . 5 is measured for different selectively variable RF frequencies within the range of interest, namely, within the frequency band 10 KHz–42 MHz. These measurements are made without subjecting the person to RF radiation. Since the resistance of the human body is frequency dependent, the measured resistance for any given body section or zone varies with frequency, and more particularly decreases with increasing frequency. For purposes of convenience, it is desirable to normalize the various impedance measurements of body zone resistances $R_1, R_2, \ldots R_5$ at the various frequencies over the 10 KHz–42 MHz range with respect to the measured impedance at a frequency of 10 KHz. This is done by dividing the measured resistances of each zone by the largest measured resistance for the respective zone, and plotting the quotient, the normalization factor K, as a function of frequency over the frequency range of interest. A plot of the normalization constant $K_{st}$ corresponding to the standing posture and the corresponding constant $K_{si}$ corresponding to the sitting posture, appears in FIG. 3. With reference to FIG. 3 it is noted that the normalization constants for the standing and sitting postures, $K_{st}$ and $K_{si}$, are substantially identical over the frequency range of interest, with the constants $K_{st}$ and $K_{si}$ varying with frequency from 1.0 to 0.5. For convenience, the normalization constant K over the frequency range of interest is considered to have a constant average value of approximately K=0.7 for both $K_{st}$ and $K_{si}$.

The respective RF currents $I_1, I_2, \ldots I_5$ flowing through the body section impedances $R_1, R_2, \ldots R_5$ can be calculated. More particularly, an individual having a nominal height of 1.75 meters and nominal weight of 70 kilograms is subjected to the type of radiation of interest, for example, plane-wave radiation from a far-field source, such as an AM broadcasting transmitter with the person in the posture of interest, for example, standing. A conventional RF voltage meter having a pair of test probes is then used to measure the voltage across each of the body zones or sections of interest. RF voltage meters are commercially available from John Fluke Company, Inc., located at Everett, Wash., designated Model 8060A. Having measured the RF voltage across the body sections or zones of interest, such as across the individual's head and neck zone 1, when subjected to radiation in the desired posture from a specific type of source, and having previously measured the impedance $R_1$ of the head in the manner described above, the RF current $I_1$ passing through the individual's head and neck can be calculated for the specific posture and radiation source type by dividing the measured RF voltage $V_1$ by the measured impedance $R_1$. In a similar manner, the RF currents $I_2$, $I_3$, $I_4$, and $I_5$ flowing through the remaining body zones 2, 3, 4, and 5 can be calculated.

As noted, the currents $I_1$, $I_2$, ... $I_5$ induced in different zones of a person's body will vary depending on whether the person is standing or sitting, and whether the radiation source is near-field or far-field. Thus, separate measurements of the RF voltages for the body zones 1, 2, ... 5 must be made for each situation, and the currents $I_1$, $I_2$, ... $I_5$ for the zones separately calculated.

As noted previously, the dosimeter of this invention, particularly the foot current sensor 10, can provide a measurement correlated to the foot current $I_F$ flowing between the sole of the user's foot 16 and electrically grounded surface 20.

Calculation of the equivalent resistance $R_{eq}$ that provides the power or energy absorbed by the body, per unit body weight, as a function of the measured foot current $I_F$, to facilitate utilization of the dosimeter of FIG. 1 to indicate the specific absorption rate (SAR) in accordance with the formula:

$$SAR = (1/W) I_F^2 R_{eq} \qquad [1]$$

is accomplished in the following manner. More particularly, when an individual is subjected to radiation and the body currents $I_1$, $I_2$, ... $I_5$ calculated in the manner indicated above, the specific absorption rate SAR is equal to the summation of the power absorbed by the various zones 1, 2, ... 5 of the body divided by the individual's weight W. The energy absorbed for an individual section or zone of an individual's body is given by the equation:

Absorbed energy = $I^2 R$, where

I = the calculated current flowing through the particular section of interest of the user's body under irradiation conditions, and R = the measured impedance of the body section.

In accordance with the foregoing, the specific absorption rate for an individual subject to irradiation can be calculated in accordance with the following equation:

$$SAR = 1/W \\ [I_1^2 R_1 + I_2^2 R_2 + I_3^2 R_3 + 2(I_4/2)^2 R_4 + 2(I_5/2)^2 R_5] \qquad [2]$$

where $I_1$, $I_2$, ... $I_5$ are the currents through the respective body zones 1, 2, ... 5 which have been calculated in a manner described above, and $R_1$, $R_2$, ... $R_5$ are the measured RF impedances of the various body sections 1, 2, ... 5.

The right side of equation [2] is multiplied by $$(I_5/2)^2/(I_5/2)^2$$

for the purpose of providing the equation in more usable form. The result of the foregoing multiplication transforms equation [2] into the following form:

$$SAR = \frac{1}{W} [(I_5/2)^2] \left[ \frac{I_1^2}{(I_5/2)^2} R_1 + \frac{I_2^2}{(I_5/2)^2} R_2 + \right. \qquad [3]$$

$$\left. \frac{I_3^2}{(I_5/2)^2} R_3 + \frac{2(I_4/2)^2}{(I_5/2)^2} R_4 + \frac{2(I_5/2)^2}{(I_5/2)^2} R_5 \right]$$

A simplification of equation [3] results in the following:

$$SAR = 1/W [(I_5/2)^2][4(I_1/I_5)^2 \\ R_1 + 4(I_2/I_5)^2 + 4(I_3/I_5)^2 R_3 + 2(I_4/I_5)^2 \\ R_4 + 2(I_5/I_5)^2 R_5] \qquad [4]$$

Since the foot current $I_F$ equals $I_5/2$, the term $2 I_F$ is substituted for $I_5$ in equation [4], transforming equation [4] into the following form:

$$SAR = 1/W \\ [(2I_F/2)^2][4(I_1/2I_F)^2 R_1 + 4(I_2/2I_F)^2 R_2 \\ + 4(I_3/2I_F)^2 R_3 + 2(I_4/2I_F)^2 R_4 + 2R_5] \qquad [5]$$

A simplification of equation [5] produces the following equation for specific absorption rate (SAR):

$$SAR = 1/W [I_F^2][(I_1/I_F)^2 R_1 + (I_2/I_F)^2 R_2 + (I_3/I_F)^2 R_3 + \tfrac{1}{2}(I_4/I_F)^2 R_4 + 2R_5] \qquad [6]$$

In comparing equation [6] to equation [1], $SAR = 1/W I_F^2 R_{eq}$, it is noted that the bracketed 5-term expression in equation [6] is the equivalent resistance, $R_{eq}$. Thus, by definition the equivalent resistance $R_{eq}$ is:

$$R_{eq} = [(I_1/I_F)^2 R_1 + (I_2/I_F)^2 R_2 + (I_3/I_F)^2 R_3 + \tfrac{1}{2}(I_4/I_F)^2 R_4 + 2R_5] \qquad [7]$$

Also note that the ratios $I_1/I_F$, $I_2/I_F$, $I_3/I_F$, and $I_4/I_F$ in the expression [7] for the equivalent resistance $R_{eq}$ are ratios of the current flowing through zones 1, 2, 3, and 4 with respect to the foot current flowing through one foot of zone 5, which foot current $I_F$ can be measured with the sensor 10 of the dosimeter shown in FIG. 1. These current ratios $I_1/I_F$, $I_2/I_F$, $I_3/I_F$, and $I_4/I_F$ are not dependent upon the frequency of the radiation, although the actual values of $I_1$, $I_2$, $I_3$, $I_4$, and $I_F$ do increase with increasing frequency of radiation (and whether the person is sitting or standing as well as whether the radiation source is near-field or far-field). Thus, the equivalent resistance $R_{eq}$ defined by expression [7] is not dependent upon the frequency of radiation, although it will vary depending on whether the person is sitting or standing and whether the radiation is near-field or far-field.

The numerical value of the equivalent resistance $R_{eq}$, for example, for far-field radiation of a standing person, is now calculated using the values of $I_1$, $I_2$, $I_3$, $I_4$, and $I_F$ previously calculated for far-field radiation conditions of a standing person, as described above, and the impedance values $R_1$, $R_2$, $R_3$, $R_4$, and $R_5$ measured in the manner previously described. The calculated equivalent resistance $R_{eq}$ can be made to take into account the fact that impedance is dependent upon the frequency of radiation, as noted previously, if the impedance normalizing factor $K = 0.7$ is used in calculating the values of $R_1$, $R_2$, ... $R_5$. In addition, variation of the current flowing in various regions of the body as a function of frequency for a given type of source has been taken into account in computing the equivalent resistance $R_{eq}$ by using the ratios $I_1/I_F$, $I_2/I_F$, $I_3/I_F$, $I_4/I_F$, which ratios do not change with frequency by reason of the fact the spatial distribution of induced currents flowing in the body is independent of frequency. Furthermore, the spatial distribution of current is not significantly different for standing and sitting postures as is apparent from a comparison of FIGS. 4b and 5b for standing and sitting postures, respectively, which have essentially the same profile. This results in $R_{eq}$ for sitting and standing postures being nearly the same (see FIG. 7). When $R_{eq}$ is averaged for far-field conditions (FIG. 7), an equivalent resistance $R_{eq}$ of approximately 400 ohms results.

For near-field calculations of $R_{eq}$, the currents $I_1$, $I_2$, ... $I_5$ must be calculated using voltage measurements obtained with a person subjected to near-field radiation, either standing or sitting as the case may be. Once this has been done $R_{eq}$ can be calculated using equation [7]. For example, $R_{eq}$ values for near-field source radiation of a 1.6 meter tall male have been calculated at 780 ohms and 960 ohms for standing and sitting postures, respectively.

In lieu of making one calculation of equivalent resistance $R_{eq}$ over the entire frequency range of interest using a single value for each of the resistances $R_1$, $R_2$, $R_3$, $R_4$, and $R_5$ which incorporates a single normalization constant $K=0.7$, multiple equivalent resistance computations could be made for the different frequencies in the band of interest using the actual measured values of resistance $R_1$, $R_2$, $R_3$, $R_4$, and $R_5$ at the various frequencies, and then the multiple equivalent resistance values at the various frequencies could be averaged to provide a single equivalent resistance $R_{eq}$ which would represent an approximation of the equivalent resistance over the entire frequency range of interest for a given type of posture (sitting or standing) and specific type of source (near-field or far-field). Based on such an approach, equivalent resistance $R_{eq}$ values at different frequencies, which are tabulated in FIG. 7 for standing and sitting postures, show approximate average $R_{eq}$ values of 400 ohms. Thus, the average equivalent resistance of the tabulated values for the sitting and standing postures closely approximates the equivalent resistance calculated using the expression of equation [7] utilizing single values for impedances $R_1$, $R_2$, $R_3$, $R_4$, and $R_5$ which incorporate the average normalization factor $K=0.7$ discussed hereinabove. The foregoing rationale applies regardless of whether the radiation is near-field or far-field.

Knowing the equivalent resistance $R_{eq}$, the user's weight W, and the measured foot current $I_F$, the dosimeter shown in FIG. 1 and described hereinabove can display the specific absorption rate in units of watts/Kg as a result of measuring the current flowing from one of the user's feet 16 to ground 20 via the foot mounted sensor 10. In addition, by appropriate integration over an arbitrary period, for example six minutes, dosage over a six minute interval can be displayed.

If the dosimeter of this invention is to be utilized to display specific absorption rate (SAR) and/or the accumulated dosage over a specific time interval, such as six minutes, for near-field radiation conditions for a standing (sitting) posture, the equivalent impedance $R_{eq}$ must be recalculated utilizing actual currents $I_1$, $I_2$, $I_3$, $I_4$, and $I_5$ flowing through body zones 1, 2, 3, 4, and 5, respectively, calculated under conditions of irradiation of an individual with near-field radiation while standing (sitting). Once the currents $I_1$, $I_2$, $I_3$, $I_4$, and $I_5$ flowing in body zones 1, 2, 3, 4, and 5, respectively, of a standing (sitting) person, under conditions of near-field radiation have been calculated as described above, the equivalent resistance $R_{eq}$ can be calculated for the standing (sitting) posture and factored into the multiplier 30 via line 34 of the dosimeter of FIG. 1, enabling the dosimeter to display specific absorption rate and accumulated dosage over a specific interval for near-field radiation conditions for a standing (sitting) posture. Thus, it is apparent that applicant's dosimeter provides a relatively simple, inexpensive, and conveniently usable apparatus and method for providing specific absorption rate and accumulated dose readings to a user, either standing or sitting, and whether subjected to either near-field or far-field radiation in the frequency range of 10 KHz–42 MHz which corresponds to the band of radiation in which a variety of commercially available equipment emits.

The displays 40 and 46 can be packaged with the signal processing circuit components 21, 22, 26, and 30, and the entire assembly mounted either on the user's ankle proximate the current sensor 10. Alternatively, the assembly, including displays and associated signal processing components, could be mounted on the user's shirt pocket or other convenient place, in which event appropriate wiring interconnecting the display and circuit assembly would be required.

While a preferred embodiment of the invention has been described, it will occur to those skilled in the art that a variety of changes can be made without departing from the spirit and scope of the invention which is defined by the claims which follow. For example, and while not convenient since it interferes with the ability of a user to work with his hands, the sensor 10 could be placed between one of the user's hands and a grounded surface, providing the user is otherwise electrically insulated from ground potential. Also, resistor $R_s$ could be connected between the plates 10a and 10b at the edges thereof, rather than between a central portion thereof as shown in FIG. 1.

What is claimed is:

1. Apparatus capable of being worn by a person subjected to radiation for providing an indication of the amount of energy absorbed by the person in a frequency range which includes frequencies having free space wavelengths greater than approximately four times the height of the person, said apparatus comprising:
   means for sensing the electrical current induced in the person flowing between the person and an external source of reference potential, said sensing means providing a sensed-current signal correlated to the magnitude of said current flow from person to said external source of reference potential in said frequency range;
   computing means responsive to said sensed-current signal for providing a signal correlated to the energy absorbed by the person in said frequency range based on a factor correlated to the impedance of each of a plurality of portions of the body of the person; and
   indicating means responsive to said computing means to provide a humanly perceptible output correlated to said energy absorbed by the person.

2. The apparatus of claim 1 wherein
   said sensing means comprises:
   a pair of electrically conductive spaced, parallel plates and an electrically insulating substrate therebetween; and
   an impedance electrically connected between said plates through which said current induced by said radiation flows to said external source of reference potential;

said sensed-current signal output from said sensing means being variable in accordance with the variation in voltage across said impedance caused by said radiation-induced current flow from said person through said impedance to said external source of reference potential.

3. The apparatus of claim 2 wherein said impedance is a noninductive resistor having a relatively small resistance.

4. The apparatus of claim 2 wherein said source of reference potential is a foot support for said person, and wherein said plates are shaped to conform to the approximate shape of one of said person's feet for disposition between said person's foot and said foot support.

5. The apparatus of claim 4 further including dummy impedance means positionable between the other of said person's feet and said foot support to equalize the flow of radiation-induced current between said foot support and each of said person's two feet.

6. The apparatus of claim 2 wherein said sensing means includes:

a band pass filter connected between said impedance and said computing means for passing to said computing means sensed-current signals only in said frequency range.

7. The apparatus of claim 1 wherein said computing means includes multiplying means for multiplying said sensed-current signals by a calibration factor correlated to (a) the reciprocal of the person s weight 1/W, and (b) the equivalent impedance that correlates the power absorbed by the person as a function of said sensed current signal.

8. A method of providing an indication of the amount of energy absorbed by a person subjected to radiation in a frequency range which includes frequencies having free space wavelengths greater than approximately four times the height of the person, comprising the steps of:

sensing the electrical current induced in the person flowing between the person and an external source of reference potential and in response thereto generating a sensed-current signal correlated to the magnitude of the current flow from the person in the frequency range;

computing, in response to the sensed-current signal, the energy absorbed by the person in the frequency range and generating an absorbed energy signal correlated thereto based on a factor correlated to the impedance of each of a plurality of portions of the body of the person; and generating, in response to said absorbed energy signal, a humanly perceptible indication of the amount of energy absorbed by the person.

9. The method of claim 8 wherein said sensing step includes generating a sensed-current signal variable in accordance with the variation in voltage across an impedance connected between a pair of electrically conductive spaced plates located between the person and the source of reference potential through which the radiation-induced current flows from the person to the source of reference potential.

10. The method of claim 8 further including tha step of supporting the person's foot on a foot support connected to the source of reference potential and positioning the pair of spaced conductive plates between the person's foot and the foot support.

11. The method of claim 10 wherein said positioning step includes positioning the spaced conductive plates which are shaped to conform to the sole of the person's foot in the person's shoe between the sole of the person's foot and the insole of the shoe, said method including the further step of:

positioning a dummy pair of spaced conductive plates with an impedance connected thereacross between the sole of the other foot of the person and the insole of his associated shoe, and supporting the foot on the foot support to equalize the flow of radiation-induced current between both of the person's feet and the foot support.

12. The method of claim 8 wherein said sensing step includes band pass filtefing the sensed-current signal to exclude signal components outside said frequency range.

13. The method of claim 8 wherein said computing step includes multiplying said sensed-current signal by a calibration factor correlated to (a) the reciprocal of the person's weight 1/W, and (b) the equivalent impedance that relates the power absorbed by the person to said sensed current signal.

14. A method of measuring the amount of radio frequency radiation energy per unit mass absorbed by a human body in a frequency range of interest comprising the steps of:

measuring within said frequency range of interest the electrical impedance $R_1, R_2, \ldots R_n$, of n non-overlapping, vertically disposed body zones $1, 2, \ldots n$, respectively, the nth body zone being that body zone which includes both feet so that $R_1, R_2 \ldots$ represent the impedance of each respective body zone $1, 2 \ldots$ except that $R_{n-1}$ represents one-half the impedance of the zone which includes both legs exclusive of the feet and $R_n$ represents one-half the impedance of the zone which includes both feet;

measuring the voltage $V_1, V_2, \ldots V_{n-1}$ induced across each respective body zone $1, 2, \ldots n-1$ by said radio frequency radiation while said body zones are subjected to said radio frequency radiation;

computing the current flow, $I_1, I_2, \ldots I_{n-1}$ induced in each respective body zone $1, 2, \ldots n-1$ due to said radio frequency radiation based upon said respective measured values of said electrical impedances $R_1, R_2, \ldots R_{n-1}$ of each respective body zone $1,2, \ldots n-1$ and said measured voltages $V_1, V_2, \ldots V_{n-1}$ across each respective body zone according to the equation $I=V/R$;

measuring the foot current, $I_F$ flowing through one foot while said body is subjected to said radio frequency radiation;

computing specific absorption ratio (SAR) according to the equation:

$$SAR = (1/W)I_F^2[(I_1/I_F)^2 (R_1) + (I_2/I_F)^2 (R_n) + \ldots + \tfrac{1}{2}(I_{n-1}/I_F)^2 R_{n-1} + 2R_n)]$$

wherein:

$I_1, I_2, \ldots, I_{n-1}$ is the current flow through each body zone $1,2, \ldots n-1$ respectively and in particular, $I_{n-1}$ is the current flow in the zone including both legs and the foot current $I_F$ is equal to one-half the cuurent flowing in said nth body zone which includes both feet and $R_1, R_2, \ldots R_n$ are said electrical impedances of each body zone $1, 2, \ldots n$ respectively except that $R_{n-1}$ represents one-half the impedance of the zone which includes both legs and $R_n$ represents one-half of the impedance of the zone which includes both feet; and W is the mass of said body;

$I_F$ is said measured foot current.

15. The method of claim 14 further comprising the step of displaying said specific absorption ration (SAR) in humanly perceptible form.

16. The method of claim 14 further comprising the step of computing a dose measurement by integrating specific absorption ratio over an interval of time.

17. The method of claim 16 further comprising the step of displaying said dose measurement in humanly perceptible form.

18. The method of claim 16 wherein said integral of time is approximatley 6 (six) minutes.

19. An apparatus for measuring the amount of radio frquency radiation energy per unit mass absorbed by a human body in a frequency range of interest, comprising:

means for measuring within said frequency range of interest the electrical impedance $R_1, R_2, \ldots R_n$, of n non-overlapping, vertically disposed body zones 1, 2, ... n, respectively, the nth body aone being that body zone which includes both feet so that $R_1, R_2 \ldots$ represent the impedance of each respective body zone 1, 2 ... except that $R_{n-1}$ represents one-half the impedance of the zone which includes both legs exclusive of the feet and $R_n$ represents one-half the impedance of the zone which includes both feet;

means for measuring the voltage $V_1, V_2, \ldots V_{n-1}$ induced across each respective body zone 1, 2, ... n−1 by said radio frequency radiation while said body zones are subjected to said radio frequency radiation;

means for computing the current flow, $I_1, I_2, \ldots I_{n-1}$ induced in each respective body zone 1, 2, ... n−1 due to said radio frequency radiation based upon said respective measured values of said electrical impedances $R_1, R_2, \ldots R_{n-1}$ of each respective body zone 1, 2, ... n−1 and said measured voltages $V_1, V_2, \ldots V_{n-1}$ across each respective body zone according to the equation I=V/R;

means for measuring the foot cuurent, $I_F$ flowing through one foot while said body is subjected to said radio frequency radiation;

means for computing specific absorption ratio (SAR) according to the equation:

$$SAR = (1/W)I_F^2[(I_1/I_F)^2 (R_1) + (I_2/I_F)^2 (R_n) + \ldots + \tfrac{1}{2}(I_{n-1}/I_F)^2 R_{n-1} + 2R_n)]$$

wherein:

$I_1, I_2 \ldots I_{n-1}$ is the current flow through each body zone 1, 2, ... n−1 respectively and in particular, $I_{n-1}$ is the current flow in the zone including both legs and the foot current $I_F$ is equal to one-half the current flowing in said nth body zone which includes both feet and $R_1, R_2, \ldots R_n$ are said electrical impedances of each body zone 1, 2, ... n respectively except that $R_{n-1}$ represents one-half the impedance of the zone which includes both legs and $R_n$ represents one-half of the impedance of the zone which includes both feet; and W is the mass of said body;

$I_F$ is said measured foot current.

20. The apparatus of claim 19 further comprising means for displaying said specific absorption ration (SAR) in humanly perceptible form.

21. The apparatus of claim 19 further comprising means for computing a dose measurement by integrating specific absorption ratio over an interval of time.

22. The apparatus of claim 21 further comprising means for displaying said dose measurement in humanly perceptible form.

23. The apparatus of claim 21 wherein said internal of time is 6 (six) minutes.

24. A method of measuring the amount of radio frequency radiation energy per unit mass absorbed by a human body in a frequency range of interest comprising the steps of:

measuring within said frequency range of interest the electrical impedance $R_1, R_2, \ldots R_x$ of x non-overlapping, vertically disposed body zones located above the groin as well as the electrical impedance $R_{x+1}, R_{x+2} \ldots R_y$ of y non-overlapping body zones x−1, x+2 ... y located below the groin, the yth body zone being that body zone which includes both feet, where each of said measured impedances $R_{x+1}, R_{x+2} \ldots R_y$ represents one-half the total electrical impedance of each respective body zone x+1, X+2 ... y located below the groin whereas each of said measured impedances $R_1, R_2 \ldots R_x$ represents the total value of each respective body zone 1, 2 ... x located above the groin;

measuring the voltage $V_1, V_2 \ldots V_x, V_{x+1} \ldots V_y$ induced across each respective body zone 1, 2 ... x, x+1 ... y by said radio frequency radiation while said body zones are subjected to said radio frequency radiation;

computing the current flow $I_1, i_2 \ldots I_{x+1} \ldots I_y$ induced in each respective body zone 1, 2 ... x, x+1 ... y by said radio frequency radiation based upon said measured values of said electrical impedances $R_1, R_2 \ldots R_x, R_{x+1} \ldots R_y$ of each respective body zone 1,2, ... x, x+1 ... y and said measured voltages $V_1, V_2 \ldots V_x, V_{x+1} \ldots V_y$ across each respective body zone according to the equation I=V/R;

measuring the foot current $I_F$ flowing through one foot while said body is subjected to said radio frequency radiation;

computing specific absorption ratio (SAR) according to the equation:

$$SAR = (1/W)I_F^2 [(I_1/I_F)^2 R_1 + (I_2/I_F)^2 R_2 + \ldots (I_x/I_F)^2 R_x] + \tfrac{1}{2}[(I_{x+1}/I_F)^2 R_{x+1} + (I_{x+2}/I_F)^2 R_{x+2} + \ldots] + 2 R_y$$

wherein in addition to those terms defined above, W is the mass of said body.

25. The apparatus of claim 2 wherein said sensing means is operatively disposed to sense said sensed-current signal flowing from only one of the feet of said person.

* * * * *

UNITED STATES PATENT AND TRADEMARK OFFICE
CERTIFICATE OF CORRECTION

PATENT NO. : 4,672,309
DATED : June 9, 1987
INVENTOR(S) : Om P. Gandhi

It is certified that error appears in the above-identified patent and that said Letters Patent is hereby corrected as shown below:

Col. 5, line 15, between "$\frac{1}{2}R_S^2$," and "input", insert -- is --.

Col. 7, line 14, "R2" should be --$R_2$--.

Col. 13, line 64, "tha" should be -- the --.

Col. 14, line 65, "cuurent" should be -- current --.

Col. 15, line 17, "approximatley" should be -- approximately --.

Col. 15, line 19, "frquency" should be -- frequency --.

Col. 15, line 25, "aone" should be --zone --.

Col. 15, line 46, "cuurent" should be -- current --.

Signed and Sealed this

Eighth Day of March, 1988

*Attest:*

DONALD J. QUIGG

*Attesting Officer*     *Commissioner of Patents and Trademarks*